(12) United States Patent
Shi

(10) Patent No.: US 10,333,086 B2
(45) Date of Patent: Jun. 25, 2019

(54) FLEXIBLE DISPLAY PANEL FABRICATION METHOD AND FLEXIBLE DISPLAY PANEL

(71) Applicant: Shenzhen China Star Optoelectronics Semiconductor Display Technology Co., Ltd., Shenzhen (CN)

(72) Inventor: Wen Shi, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/574,831

(22) PCT Filed: Sep. 15, 2017

(86) PCT No.: PCT/CN2017/101971
§ 371 (c)(1),
(2) Date: Nov. 16, 2017

(87) PCT Pub. No.: WO2019/037166
PCT Pub. Date: Feb. 28, 2019

(65) Prior Publication Data
US 2019/0058140 A1    Feb. 21, 2019

(30) Foreign Application Priority Data
Aug. 21, 2017  (CN) .......................... 2017 1 0720612

(51) Int. Cl.
*H01L 51/00* (2006.01)
*H01L 51/56* (2006.01)
*H01L 27/32* (2006.01)

(52) U.S. Cl.
CPC .......... *H01L 51/0097* (2013.01); *H01L 27/32* (2013.01); *H01L 27/3246* (2013.01);
(Continued)

(58) Field of Classification Search
CPC ........................................ H01L 21/30
See application file for complete search history.

(56) References Cited

U.S. PATENT DOCUMENTS

2016/0300898 A1*  10/2016  Kim ................. H01L 27/3262

FOREIGN PATENT DOCUMENTS

| CN | 102280452 A | 12/2011 |
|---|---|---|
| CN | 202916556 U | 5/2013 |

(Continued)

*Primary Examiner* — Cheung Lee
(74) *Attorney, Agent, or Firm* — Leong C. Lei

(57) ABSTRACT

A flexible display panel fabrication method and a flexible display panel where the method first subjects a photoresist layer to patterning to form a plurality of mutually spaced photoresist zones, a through hole being formed between every two adjacent ones of the photoresist zones; and then, subjecting the flexible backing plate to cavity formation with the photoresist zones as a mask so as to form a plurality of mutually parallel backing cavities respectively at locations corresponding to the through holes; and then, depositing a metal film and subsequently removing the photoresist zones and portions of the metal layer located thereon to form a plurality of metal patterns embedded in the plurality of mutually parallel backing cavities, each of the metal patterns including a scan line and a plurality of gate electrodes; and then, forming a plurality of TFTs arranged in an array and OLED light emissive elements.

13 Claims, 4 Drawing Sheets

(52) U.S. Cl.
CPC ...... *H01L 27/3248* (2013.01); *H01L 27/3258* (2013.01); *H01L 27/3262* (2013.01); *H01L 27/3276* (2013.01); *H01L 51/0016* (2013.01); *H01L 51/0023* (2013.01); *H01L 51/56* (2013.01); *H01L 2227/323* (2013.01); *H01L 2251/5338* (2013.01); *H01L 2251/558* (2013.01)

(56) References Cited

FOREIGN PATENT DOCUMENTS

| | | |
|---|---|---|
| CN | 104393019 A | 3/2015 |
| CN | 106449660 A | 2/2017 |
| KR | 20170079854 A | 7/2017 |
| TW | 546853 B | 8/2003 |

\* cited by examiner

FLEXIBLE DISPLAY PANEL FABRICATION METHOD AND FLEXIBLE DISPLAY PANEL

BACKGROUND OF THE INVENTION

1. Field of the Invention

The present invention relates to the field of display technology, and more particular to a flexible display panel fabrication method and a flexible display panel.

2. The Related Arts

In the field of display technology, flat panel displays, such as liquid crystal displays (LCDs) and organic light-emitting diode (OLED) displays, have gradually taken the place of cathode ray tube (CRT) displays.

Further, a liquid crystal display panel is generally made up of a color filter (CF) substrate, a thin-film transistor (TFT) array substrate, and a liquid crystal layer filled between the two substrates. The CF substrate and the TFT substrate are generally formed of a backing plate that is made of rigid glass so that the liquid crystal display panel that is made in the form of a flat panel may not be flexed.

An OLED display panel is a kind of flexible display panel. The flexible display panel is made of a flexible material and may proceed with displaying in a state of being arbitrarily flexible and deformable. Flexible display panels, such as OLED, have various advantages, such as lightweight, small size, being easy to carry, being resistant to high and low temperatures, being resistant to impact, excellent capability of shock resistance, being adapted to a wide range of operation conditions, being curvable, and having better art aesthetics for outside appearance, and are becoming a hot spot of research and study for academic institutes and research facility.

A known flexible display panel generally comprises a flexible base plate on one side of which a TFT array, light emissive devices, and driver circuits that drive the TFT array are provided. The driver circuits that drive the TFT array also include scan lines. When the known flexible display panel is curved or flexed, the driver circuits that include the scan lines may undergo curving and flexing with the surface of the flexible base plate and stress defects are induced and would affect normal performance of the TFTs and the light emissive devices.

Thus, the prior art still needs for further improvement and progress.

SUMMARY OF THE INVENTION

An objective of the present invention are to provide a flexible display panel fabrication method, which effectively reduces stress defects induced in scan lines during curving of a flexible display panel so as to improve the stability of the flexible display panel.

Another objective of the present invention is to provide a flexible display panel, in which scan lines has reduced stress defects during curving of the flexible display panel so as to improve the stability of the flexible display panel.

To achieve the above objective, the present invention first provides a flexible display panel fabrication method, which comprises the following steps:

Step S1: providing a flexible backing plate and depositing a photoresist layer on the flexible backing plate;

Step S2: subjecting the photoresist layer to patterning so as to form a plurality of mutually spaced photoresist zones, wherein a through hole is formed in two adjacent ones of the photoresist zones;

Step S3: subjecting the flexible backing plate to cavity formation conducted with the photoresist zones as a mask so as to form a plurality of mutually parallel backing cavities respectively at locations corresponding to the through holes;

Step S4: depositing a metal film on the photoresist zones and the flexible backing plate to form a metal layer covering the photoresist zones and a plurality of metal patterns that are embedded in the plurality of mutually parallel backing cavities, wherein each of the metal patterns comprises a scan line and a plurality of gate electrodes connected to the scan line;

Step S5: peeling off the photoresist zones to remove the photoresist zones and the metal layer located on the photoresist zones; and Step S6: forming a plurality of thin-film transistors (TFTs) that are arranged in an array on the flexible backing plate and each of the metal patterns embedded in the backing cavities and depositing organic light-emitting diode (OLED) light emissive elements on the plurality of TFTs that are arranged in an array.

The through holes each have opposite sidewalls each of which defines an angle that is an obtuse angle with respect to an undersurface of the photoresist zones and also defines an angle that is an acute angle with respect to an upper surface of the photoresist zones.

The through holes each have a cross section that is an isosceles trapezoid, and isosceles trapezoid has a lower base that is greater than an upper base.

The backing cavities have a depth of 300-3000 nm.

The backing cavities have a cross section that is rectangular.

The metal patterns have a thickness that corresponds to the depth of the backing cavities.

Step S6 comprises:

depositing a gate insulation layer on the flexible backing plate and the metal patterns;

depositing a semiconductor active layer on the gate insulation layer;

depositing and subjecting a metal film to patterning treatment so as to form a source electrode and a drain electrode that are respectively in contact engagement with two ends of the semiconductor active layer, wherein the gate electrode, the semiconductor active layer, the source electrode, and the drain electrode collectively form the TFT;

sequentially depositing an interlayer insulation layer, a planarization layer, and an anode, wherein the anode is connected, through a via extending through the interlayer insulation layer and the planarization layer, to the drain electrode of the TFT;

forming a patterned pixel isolation layer on the planarization layer and the anode, such that the pixel isolation layer covers portions of the planarization layer and the anode; and sequentially depositing an organic emissive layer and a cathode in an area defined by the pixel isolation layer, wherein the anode, the organic emissive layer, and the cathode collectively form the OLED light emissive element.

The present invention also provides a flexible display panel, which comprises:

a flexible backing plate, wherein the flexible backing plate comprises a plurality of mutually parallel backing cavities;

a plurality of metal patterns respectively embedded in the plurality of mutually parallel backing cavities, wherein each of the metal patterns comprises a scan and a plurality of gate electrodes connected to the scan line;

a plurality of thin-film transistors (TFTs) arranged in an array on the flexible backing plate and each of the metal patterns; and organic light-emitting diode (OLED) light emissive elements arranged on the plurality of TFTs that are arranged in an array.

The backing cavities have a depth of 300-3000 nm and a cross section that is rectangular.

The metal patterns has a thickness that corresponds to the depth of the backing cavities.

The present invention further provides a flexible display panel fabrication method, which comprises the following steps:

Step S1: providing a flexible backing plate and depositing a photoresist layer on the flexible backing plate;

Step S2: subjecting the photoresist layer to patterning so as to form a plurality of mutually spaced photoresist zones, wherein a through hole is formed in two adjacent ones of the photoresist zones;

Step S3: subjecting the flexible backing plate to cavity formation conducted with the photoresist zones as a mask so as to form a plurality of mutually parallel backing cavities respectively at locations corresponding to the through holes;

Step S4: depositing a metal film on the photoresist zones and the flexible backing plate to form a metal layer covering the photoresist zones and a plurality of metal patterns that are embedded in the plurality of mutually parallel backing cavities, wherein each of the metal patterns comprises a scan line and a plurality of gate electrodes connected to the scan line;

Step S5: peeling off the photoresist zones to remove the photoresist zones and the metal layer located on the photoresist zones; and Step S6: forming a plurality of thin-film transistors (TFTs) that are arranged in an array on the flexible backing plate and each of the metal patterns embedded in the backing cavities and depositing organic light-emitting diode (OLED) light emissive elements on the plurality of TFTs that are arranged in an array;

wherein the through holes each have opposite sidewalls each of which defines an angle that is an obtuse angle with respect to an undersurface of the photoresist zones and also defines an angle that is an acute angle with respect to an upper surface of the photoresist zones;

wherein the through holes each have a cross section that is an isosceles trapezoid, and isosceles trapezoid has a lower base that is greater than an upper base;

wherein the backing cavities have a depth of 300-3000 nm; and wherein the metal patterns has a thickness that corresponds to the depth of the backing cavities.

The efficacy of the present invention is that the present invention provides a flexible display panel fabrication method, which first subjects a photoresist layer to patterning to form a plurality of mutually spaced photoresist zones, wherein a through hole is formed between every two adjacent ones of the photoresist zones; and then, subjecting the flexible backing plate to cavity formation with the photoresist zones as a mask so as to form a plurality of mutually parallel backing cavities respectively at locations corresponding to the through holes; and then, depositing a metal film and subsequently removing the photoresist zones and portions of the metal layer located thereon to form a plurality of metal patterns that are embedded in the plurality of mutually parallel backing cavities, wherein each of the metal patterns comprises a scan line and a plurality of gate electrodes; and then, forming a plurality of TFTs that are arranged in an array and OLED light emissive elements. The method allows the scan lines and the gate electrodes to be embedded in the flexible backing plate so as to effectively reduce stress defects induced in the scan lines during curving of the flexible display panel and improve the stability of the flexible display panel. The present invention provides a flexible display panel, which comprises metal patterns that include scan lines and gate electrodes and are embedded in the baking cavities of a flexible backing plate so as to reduce stress defects induced in the scan lines during curving of the flexible display panel to thereby help improve stability of the flexible display panel.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
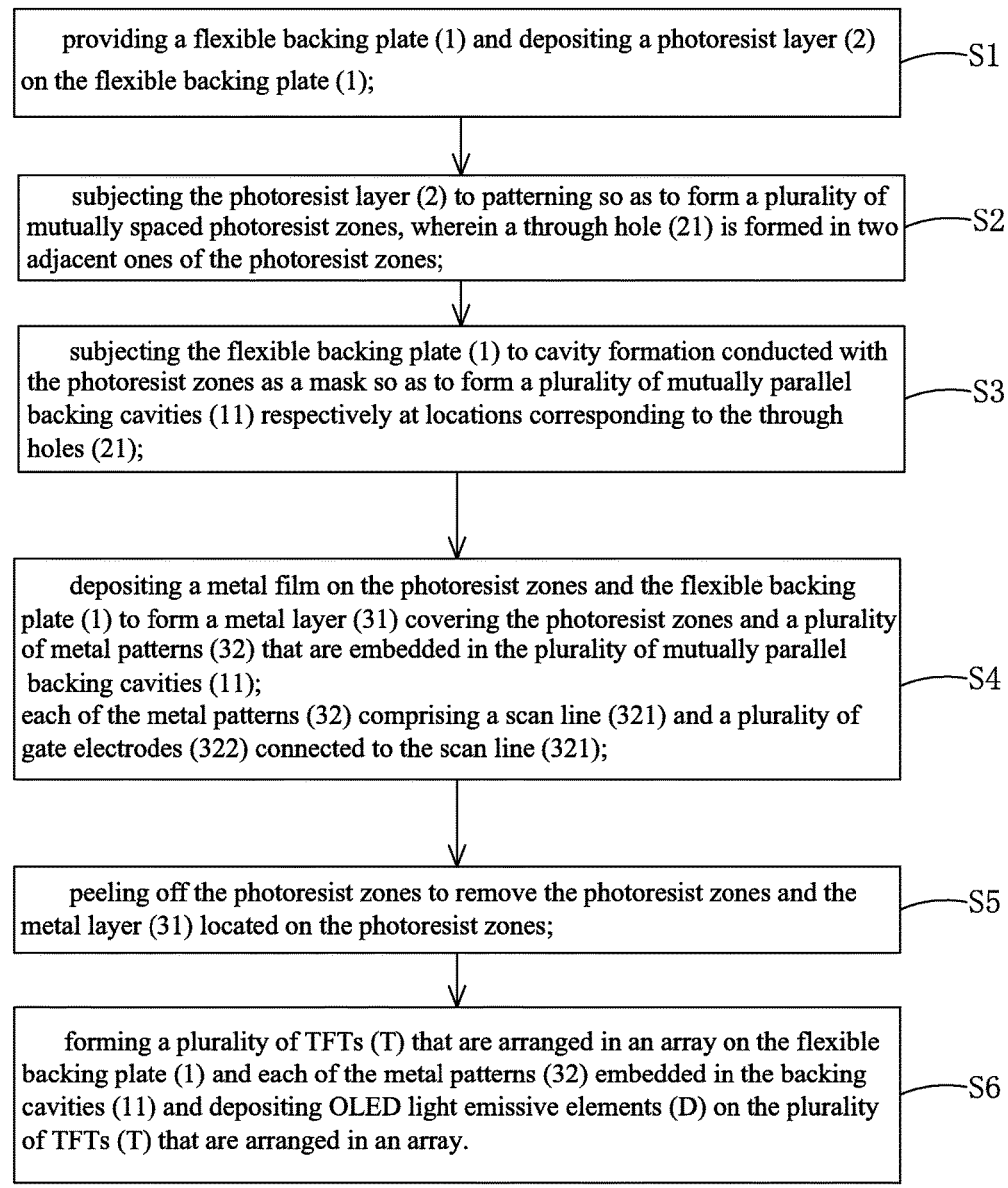
FIG. 1 is a flow chart illustrating a flexible display panel fabrication method according to the present invention.
Figure 2:
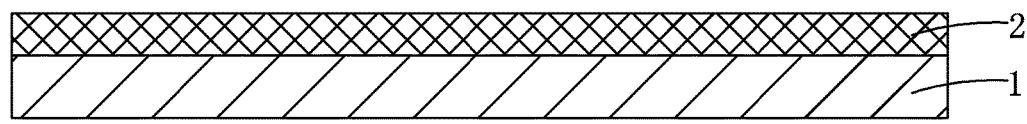
FIG. 2 is a schematic view illustrating Step S1 of the flexible display panel fabrication method according to the present invention.

Referring to FIG. 1, firstly, the present invention provides a flexible display panel fabrication method, which comprises the following steps:

Step S1: as shown in FIG. 2, providing a flexible backing plate 1 and depositing a photoresist layer 2 on the flexible backing plate 1.

Specifically, the flexible backing plate 1 is formed of a material comprising polyimide (PI) or polyethylene terephthalate (PET).

Figure 3:
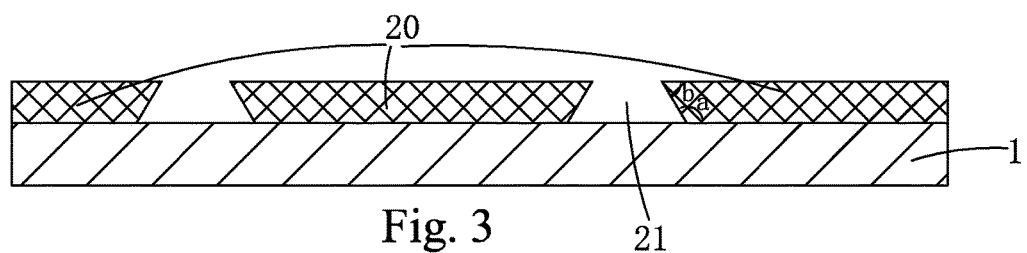
FIG. 3 is a schematic view illustrating Step S2 of the flexible display panel fabrication method according to the present invention.

Step S2: as shown in FIG. 3, subjecting the photoresist layer 2 to patterning through exposure and development so as to form a plurality of mutually spaced photoresist zones 20, wherein a through hole 21 is formed in two adjacent ones of the photoresist zones 20.

It is noted here that the through hole 21 has opposite sidewalls each defining an angle a, which is preferably an obtuse angle that is greater than 90°, with respect to an undersurface of the photoresist zones 20 and also defining an angle b, which is preferably an acute angle that is sharp, with respect to an upper surface of the photoresist zones 20.

Specifically, the through hole 21 has a cross-section shape that is an isosceles trapezoid, wherein isosceles trapezoid has a lower base that is greater than an upper base and sides of isosceles trapezoid are inclined into interiority of the material of the photoresist zones 20 while extending from top ends thereof toward the lower ends.

Figure 4:
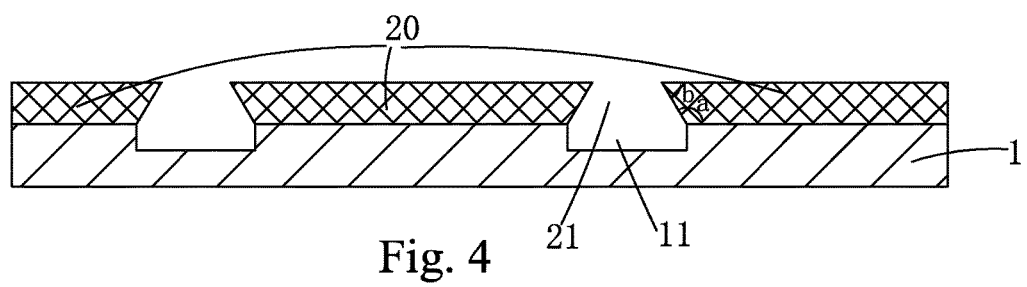
FIG. 4 is a schematic view illustrating Step S3 of the flexible display panel fabrication method according to the present invention.

Step S3: as shown in FIG. 4, subjecting the flexible backing plate 1 to cavity formation through an etching operation conducted with the photoresist zones 20 as a mask so as to form a plurality of mutually parallel backing cavities 11 respectively at locations corresponding to the through holes 21.

Specifically, the backing cavities 11 have a depth, which is preferably, 300-3000 nm in order to ensure the depth of the backing cavities 11 is smaller than a thickness of the flexible backing plate 1. Further, the backing cavities 11 have a cross-sectional shape that is rectangular.

Figure 5:
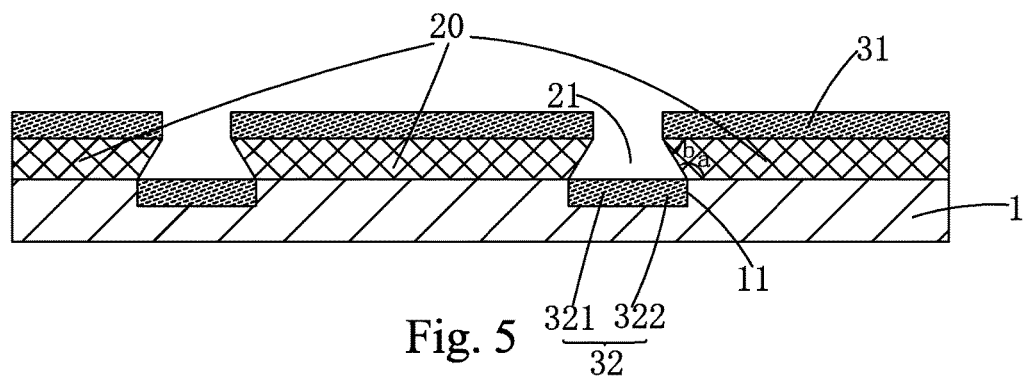
FIG. 5 is a schematic view illustrating Step S4 of the flexible display panel fabrication method according to the present invention.

Step S4: as shown in FIG. 5, depositing a metal film directly on the photoresist zones 20 and the flexible backing plate 1, wherein since the sidewalls of the through hole 21 define an angle a, which is an obtuse angle greater than 90°, with respect to the undersurface of the photoresist zones 20 and an angle b, which is a sharp acute angle, with respect to the upper surface of and the photoresist zones 2, the through hole 21 effectively breaks and divides the metal film into a metal layer 31 that covers the photoresist zones 20 and a plurality of metal patterns 32 that are embedded in the plurality of mutually parallel backing cavities 11 and show a pattern arrangement identical to the backing cavities 11.

Further, the metal patterns 32 have a thickness that corresponds to the depth of the backing cavities 11.

Figure 6:
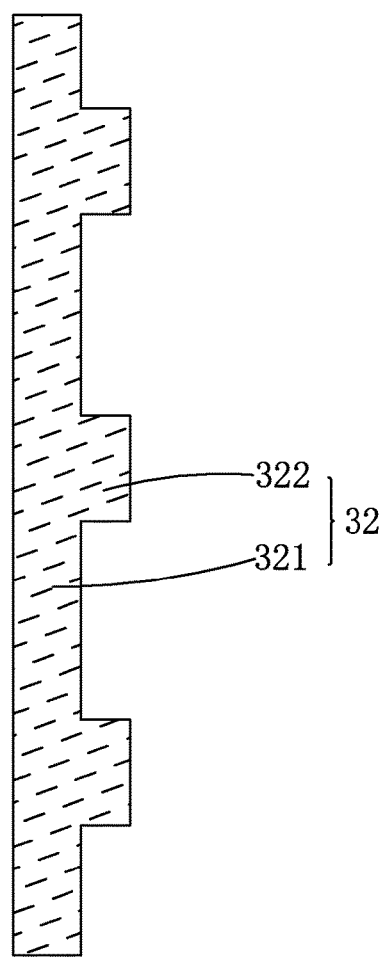
FIG. 6 is a top plan view illustrating a metal pattern made in Step S4 of the flexible display panel fabrication method according to the present invention.

As shown in FIG. 6, each of the metal patterns 32 comprises a scan line 321 and a plurality of gate electrodes 322 connected to the scan line 321.

Figure 7:
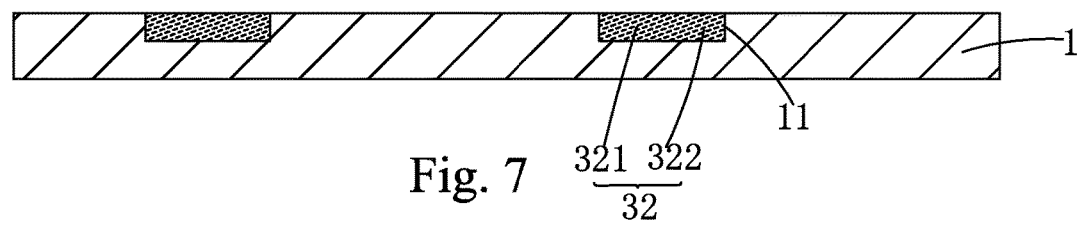
FIG. 7 is a schematic view illustrating Step S5 of the flexible display panel fabrication method according to the present invention.

Step S5: as shown in FIG. 7, peeling off the photoresist zones 20 so as to simultaneously remove the metal layer 31 that covers the photoresist zones 20, while keeping the plurality of metal patterns 32 that are embedded in the plurality of mutually parallel backing cavities 11 and show a pattern arrangement identical to the backing cavities 11.

In this process, since the through holes 21 effectively break and divide the metal film, removal of the photoresist zones 20 and the portion of the metal layer on the photoresist zones 20 does not cause any damage to the metal patterns 32 embedded in the backing cavities 11.

Figure 8:
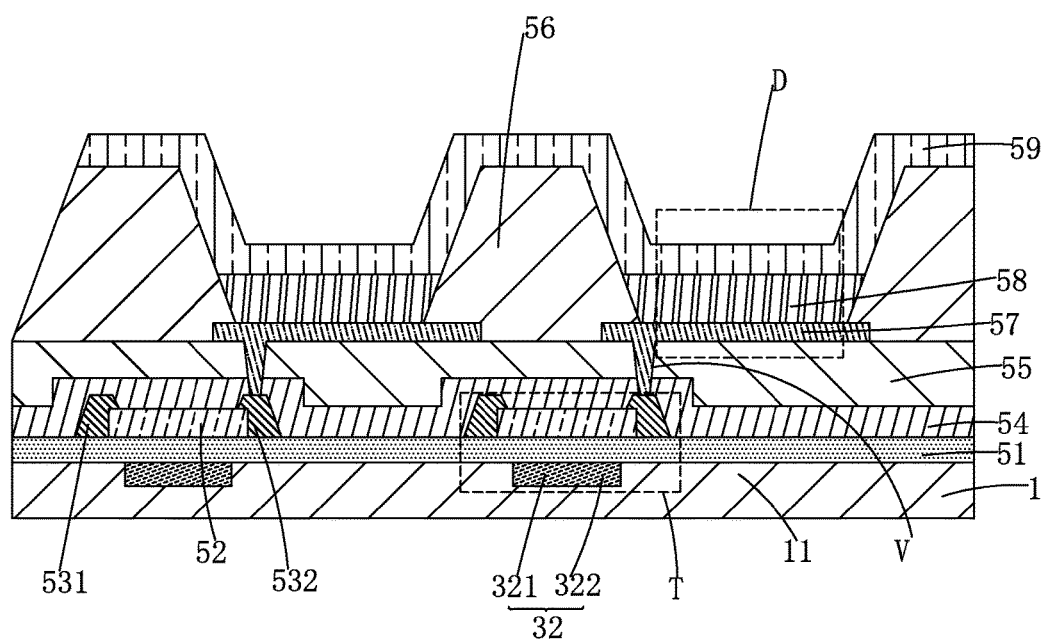
FIG. 8 is a schematic view illustrating Step S6 of the flexible display panel fabrication method according to the present invention and is also a schematic view illustrating a cross-sectional structure of a flexible display panel according to the present invention.

Step S6: as shown in FIG. 8, forming a plurality of thin-film transistors (TFTs) T that are arranged in an array on the flexible backing plate 1 and each of the metal patterns 32 embedded in the backing cavities 11 and depositing organic light-emitting diode (OLED) light emissive elements D on the plurality of TFTs T that are arranged in an array, and finally conducting an encapsulation operation.

Specifically, Step S6 comprises:
depositing a gate insulation layer 51 on the flexible backing plate 1 and the metal patterns 32;

depositing a semiconductor active layer 52 on the gate insulation layer 51;

depositing and subjecting a metal film to patterning treatment so as to form a source electrode 531 and a drain electrode 532 that are respectively in contact engagement with two ends of the semiconductor active layer 52, wherein the gate electrode 322, the semiconductor active layer 52, the source electrode 531, and the drain electrode 532 collectively form the TFT T;

sequentially depositing an interlayer insulation layer 54, a planarization layer 55, and an anode 57, wherein the anode 57 is connected, through a via V extending through the interlayer insulation layer 54 and the planarization layer 55, to the drain electrode 532 of the TFT T;

forming a patterned pixel isolation layer 56 on the planarization layer 55 and the anode 57, such that the pixel isolation layer 56 covers portions of the planarization layer 55 and the anode 57;

sequentially depositing an organic emissive layer 58 and a cathode 59 in an area defined by the pixel isolation layer 56, wherein the anode 57, the organic emissive layer 58, and the cathode 59 collectively form the OLED light emissive element D.

The method described above allows the metal patterns 32 that include the scan lines 321 and the gate electrodes 322 to be embedded in the backing cavities 11 formed in the flexible backing plate 1 and this is equivalent to forming a combined film of the metal patterns 32 and the flexible backing plate 2. In other words, the scan lines 321 and the gate electrodes 322 are integrally combined with the flexible backing plate 1 as a unitary structure and this helps spread a stress induced in the scan lines 321 during curving of the display panel thereby effectively reducing stress defects induced in the scan lines 321 during curving of the flexible display panel and thus improving stability of the flexible display panel.

Based on the same inventive idea, the present invention also provides a flexible display panel that is fabricated with the above method. Referring to FIG. 8, in combination with FIG. 6, the present invention provides a flexible display panel, which comprises:

a flexible backing plate 1, wherein the flexible backing plate 1 comprises a plurality of mutually parallel backing cavities 11;

a plurality of metal patterns 32 respectively embedded in the plurality of mutually parallel backing cavities 11, wherein each of the metal patterns 32 comprises a scan line 321 and a plurality of gate electrodes 322 connected to the scan line 321;

a gate insulation layer 51 set on and covering the flexible backing plate 1 and each of the metal patterns 32;

semiconductor active layers 52 arranged on the gate insulation layer 51;

a source electrode 531 and a drain electrode 532 respectively connected to two ends of each of the semiconductor active layers 52;

an interlayer insulation layer 54 set on and covering the semiconductor active layers 52, the source electrodes 531, the drain electrodes 532, and the gate insulation layer 51;

a planarization layer 55 set on and covering the interlayer insulation layer 54;

an anode 57 arranged on the planarization layer 55 such that the anode 57 is connected to each of the drain electrodes 532 through a via V extending through the interlayer insulation layer 54 and the planarization layer 55;

a pixel isolation layer 56 set on and covering portions of the planarization layer 55 and the anode 57; and an organic emissive layer 58 and the cathode 59 sequentially arranged, in a sequence from bottom to top, in an area defined by the pixel isolation layer 56.

The gate electrode 322, the semiconductor active layer 52, the source electrode 531, and the drain electrode 532 form the TFT T; and the anode 57, the organic emissive layer 58, and the cathode 59 form the OLED light emissive element D.

Specifically, the backing cavities 11 has a depth of 300-3000 nm and a cross section that is rectangular, and the metal patterns 32 has a thickness that corresponds to the depth of the backing cavities 11.

Since the flexible display panel of the present invention is structured such that the metal patterns 32 that include the scan lines 321 and the gate electrodes 322 is embedded in the backing cavities 11 formed in the flexible backing plate 1 and this is equivalent to forming a combined film of the metal patterns 32 and the flexible backing plate 2. In other words, the scan lines 321 and the gate electrodes 322 are integrally combined with the flexible backing plate 1 as a unitary structure and this helps spread a stress induced in the scan lines 321 during curving of the display panel thereby effectively reducing stress defects induced in the scan lines 321 during curving of the flexible display panel and thus improving stability of the flexible display panel.

In summary, the present invention provides a flexible display panel fabrication method, which first subjects a photoresist layer to patterning to form a plurality of mutually spaced photoresist zones, wherein a through hole is formed between every two adjacent ones of the photoresist zones; and then, subjecting the flexible backing plate to cavity formation with the photoresist zones as a mask so as to form a plurality of mutually parallel backing cavities respectively at locations corresponding to the through holes; and then, depositing a metal film and subsequently removing the photoresist zones and portions of the metal layer located thereon to form a plurality of metal patterns that are embedded in the plurality of mutually parallel backing cavities, wherein each of the metal patterns comprises a scan line and a plurality of gate electrodes; and then, forming a plurality of TFTs that are arranged in an array and OLED light emissive elements. The method allows the scan lines and the gate electrodes to be embedded in the flexible backing plate so as to effectively reduce stress defects induced in the scan lines during curving of the flexible display panel and improve the stability of the flexible display panel. The present invention provides a flexible display panel, which comprises metal patterns that include scan lines and gate electrodes and are embedded in the baking cavities of a flexible backing plate so as to reduce stress defects induced in the scan lines during curving of the flexible display panel to thereby help improve stability of the flexible display panel.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A flexible display panel fabrication method, comprising the following steps:
   Step S1: providing a flexible backing plate and depositing a photoresist layer on the flexible backing plate;
   Step S2: subjecting the photoresist layer to patterning so as to form a plurality of mutually spaced photoresist zones, wherein a through hole is formed in two adjacent ones of the photoresist zones;
   Step S3: subjecting the flexible backing plate to cavity formation conducted with the photoresist zones as a mask so as to form a plurality of mutually parallel backing cavities respectively at locations corresponding to the through holes;
   Step S4: depositing a metal film on the photoresist zones and the flexible backing plate to form a metal layer covering the photoresist zones and a plurality of metal patterns that are embedded in the plurality of mutually parallel backing cavities,
   wherein each of the metal patterns comprises a scan line and a plurality of gate electrodes connected to the scan line;
   Step S5: peeling off the photoresist zones to remove the photoresist zones and the metal layer located on the photoresist zones; and
   Step S6: forming a plurality of thin-film transistors (TFTs) that are arranged in an array on the flexible backing plate and each of the metal patterns embedded in the backing cavities and depositing organic light-emitting diode (OLED) light emissive elements on the plurality of TFTs that are arranged in an array.

2. The flexible display panel fabrication method as claimed in claim 1, wherein the through holes each have opposite sidewalls each of which defines an angle that is an obtuse angle with respect to an undersurface of the photoresist zones and also defines an angle that is an acute angle with respect to an upper surface of the photoresist zones.

3. The flexible display panel fabrication method as claimed in claim 2, wherein the through holes each have a cross section that is an isosceles trapezoid, and isosceles trapezoid has a lower base that is greater than an upper base.

4. The flexible display panel fabrication method as claimed in claim 1, wherein the backing cavities have a depth of 300-3000 nm.

5. The flexible display panel fabrication method as claimed in claim 4, wherein the backing cavities have a cross section that is rectangular.

6. The flexible display panel fabrication method as claimed in claim 1, wherein the metal patterns have a thickness that corresponds to the depth of the backing cavities.

7. The flexible display panel fabrication method as claimed in claim 1, wherein Step S6 comprises:
   depositing a gate insulation layer on the flexible backing plate and the metal patterns;
   depositing a semiconductor active layer on the gate insulation layer;
   depositing and subjecting a metal film to patterning treatment so as to form a source electrode and a drain electrode that are respectively in contact engagement with two ends of the semiconductor active layer, wherein the gate electrode, the semiconductor active layer, the source electrode, and the drain electrode collectively form the TFT;
   sequentially depositing an interlayer insulation layer, a planarization layer, and an anode, wherein the anode is connected, through a via extending through the interlayer insulation layer and the planarization layer, to the drain electrode of the TFT;
   forming a patterned pixel isolation layer on the planarization layer and the anode, such that the pixel isolation layer covers portions of the planarization layer and the anode; and sequentially depositing an organic emissive layer and a cathode in an area defined by the pixel isolation layer, wherein the anode, the organic emissive layer, and the cathode collectively form the OLED light emissive element.

8. A flexible display panel, comprising:
a flexible backing plate, wherein the flexible backing plate comprises a plurality of mutually parallel backing cavities;
a plurality of metal patterns respectively embedded in the plurality of mutually parallel backing cavities, wherein each of the metal patterns comprises a scan line and a plurality of gate electrodes connected to the scan line;
a plurality of thin-film transistors (TFTs) arranged in an array on the flexible backing plate and each of the metal patterns; and
organic light-emitting diode (OLED) light emissive elements arranged on the plurality of TFTs that are arranged in an array.

9. The flexible display panel as claimed in claim 8, wherein the backing cavities have a depth of 300-3000 nm and a cross section that is rectangular.

10. The flexible display panel as claimed in claim 9, wherein the metal patterns have a thickness that corresponds to the depth of the backing cavities.

11. A flexible display panel fabrication method, comprising the following steps:
Step S1: providing a flexible backing plate and depositing a photoresist layer on the flexible backing plate;
Step S2: subjecting the photoresist layer to patterning so as to form a plurality of mutually spaced photoresist zones, wherein a through hole is formed in two adjacent ones of the photoresist zones;
Step S3: subjecting the flexible backing plate to cavity formation conducted with the photoresist zones as a mask so as to form a plurality of mutually parallel backing cavities respectively at locations corresponding to the through holes;
Step S4: depositing a metal film on the photoresist zones and the flexible backing plate to form a metal layer covering the photoresist zones and a plurality of metal patterns that are embedded in the plurality of mutually parallel backing cavities,
wherein each of the metal patterns comprises a scan line and a plurality of gate electrodes connected to the scan line;
Step S5: peeling off the photoresist zones to remove the photoresist zones and the metal layer located on the photoresist zones; and Step S6: forming a plurality of thin-film transistors (TFTs) that are arranged in an array on the flexible backing plate and each of the metal patterns embedded in the backing cavities and depositing organic light-emitting diode (OLED) light emissive elements on the plurality of TFTs that are arranged in an array;
wherein the through holes each have opposite sidewalls each of which defines an angle that is an obtuse angle with respect to an undersurface of the photoresist zones and also defines an angle that is an acute angle with respect to an upper surface of the photoresist zones;
wherein the through holes each have a cross section that is an isosceles trapezoid, and isosceles trapezoid has a lower base that is greater than an upper base;
wherein the backing cavities have a depth of 300-3000 nm; and
wherein the metal patterns have a thickness that corresponds to the depth of the backing cavities.

12. The flexible display panel fabrication method as claimed in claim 11, wherein the backing cavities have a cross section that is rectangular.

13. The flexible display panel fabrication method as claimed in claim 11, wherein Step S6 comprises:
depositing a gate insulation layer on the flexible backing plate and the metal patterns;
depositing a semiconductor active layer on the gate insulation layer;
depositing and subjecting a metal film to patterning treatment so as to form a source electrode and a drain electrode that are respectively in contact engagement with two ends of the semiconductor active layer, wherein the gate electrode, the semiconductor active layer, the source electrode, and the drain electrode collectively form the TFT;
sequentially depositing an interlayer insulation layer, a planarization layer, and an anode, wherein the anode is connected, through a via extending through the interlayer insulation layer and the planarization layer, to the drain electrode of the TFT;
forming a patterned pixel isolation layer on the planarization layer and the anode, such that the pixel isolation layer covers portions of the planarization layer and the anode; and
sequentially depositing an organic emissive layer and a cathode in an area defined by the pixel isolation layer, wherein the anode, the organic emissive layer, and the cathode collectively form the OLED light emissive element.

* * * * *